United States Patent
Kawase et al.

(10) Patent No.: US 6,273,947 B1
(45) Date of Patent: Aug. 14, 2001

(54) METHOD OF PREPARING A COMPOUND SEMICONDUCTOR CRYSTAL

(75) Inventors: Tomohiro Kawase; Shinichi Sawada; Masami Tatsumi, all of Itami (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 09/274,286

(22) Filed: Mar. 22, 1999

(30) Foreign Application Priority Data

Mar. 25, 1998 (JP) .................................................. 10-077309

(51) Int. Cl.⁷ ...................................................... C30B 9/00
(52) U.S. Cl. ................................. 117/73; 117/76; 117/77; 117/81; 117/83
(58) Field of Search ................................. 117/73, 76, 77, 117/81, 83, 954; 252/62.3 GA

(56) References Cited

U.S. PATENT DOCUMENTS

| | | | |
|---|---|---|---|
| 4,999,082 | 3/1991 | Kremer et al. | 252/62.3 GA |
| 5,041,186 | * 8/1991 | Nishio et al. | 117/15 |
| 5,685,907 | * 11/1997 | Fujikawa et al. | 117/205 |
| 6,007,622 | * 12/1999 | Kawase et al. | 117/82 |

FOREIGN PATENT DOCUMENTS

| | | |
|---|---|---|
| 64-79087 | 3/1989 | (JP) . |
| 1-239089 | 9/1989 | (JP) . |
| 2-48496 | 2/1990 | (JP) . |
| 3-122097 | 5/1991 | (JP) . |

OTHER PUBLICATIONS

Advanced Electronics Series I–4 Bulk Crystal Growth Technology, by Keigo Hoshikawa, Baifukan, p. 184, Fig. 7.22; Oct. 6, 1997.

* cited by examiner

Primary Examiner—Benjamin L. Utech
Assistant Examiner—Binh X. Tran
(74) Attorney, Agent, or Firm—W. F. Fasse; W. G. Fasse

(57) ABSTRACT

A method of preparing a compound semiconductor crystal is able to dope the crystal with carbon with high reproducibility. The method includes the steps of sealing a carbon oxide gas of a predetermined partial pressure and a compound semiconductor material in a gas-impermeable airtight vessel, increasing the temperature of the vessel to melt the compound semiconductor material sealed in the vessel, and then decreasing the temperature of the vessel to solidify the melted compound semiconductor material to grow a compound semiconductor crystal containing a predetermined amount of carbon. With this method, a compound semiconductor crystal with a carbon concentration of $0.1 \times 10^{15}$ $cm^{-3}$ to $20 \times 10^{15}$ $cm^{-3}$ is prepared with high reproducibility.

20 Claims, 3 Drawing Sheets

METHOD OF PREPARING A COMPOUND SEMICONDUCTOR CRYSTAL

BACKGROUND OF THE INVENTION

1. Field of the Invention

The present invention relates to methods of preparing a compound semiconductor crystal and to the compound semiconductor crystals prepared thereby, and particularly to methods of preparing a carbon-containing, compound semiconductor crystal and compound semiconductor crystals obtained thereby.

2. Description of the Background Art

It has been conventionally well known that as for an LEC method using a stainless chamber there is a correlation between the CO gas concentration provided in the chamber and the carbon concentration of a GaAs crystal in a high-pressure Ar gas ambient.

FIG. 3 is a graph of carbon concentration in a GaAs crystal versus CO gas concentration in a LEC furnace found in Advanced Electronics Series I-4 Bulk Crystal Growth Technology, Keigo Hoshikawa, BAIFUKAN, p.184, FIG. 7.22. FIG. 3 shows that carbon concentration in a GaAs crystal and CO gas content in the LEC furnace are correlated by a straight line. In the LEC method, the correlation represented in the graph is applied to the adjustment of carbon concentration in a GaAs crystal. The carbon concentration in a GaAs crystal can be controlled by adjusting the CO gas content in the ambient gas using a CO gas cylinder and an Ar gas cylinder for dilution connected to the stainless chamber.

FIG. 4 shows an exemplary GaAs crystal growth equipment for the LEC method disclosed in Japanese Patent Laying-Open No. 1-239089. Referring to FIG. 4, Japanese Patent Laying-Open No. 1-239089 discloses a method of preparing a single crystal of compound semiconductor by placing in a predetermined gas ambient a raw-material housing portion housing a raw-material melt, detecting at least the concentration of one of $H_2$, $O_2$, $CO_2$ and CO corresponding to components of the ambient gas, and controlling the detected concentration of a component at a predetermined value to keep over the entirety of an ingot a predetermined concentration of a residual impurity mixed into a resulting single crystal.

This method can, however, not be applied in preparing a compound semiconductor crystal in a gas-impermeable airtight vessel incapable of supplying a gas from outside the airtight vessel, such as a quartz ampoule.

Japanese Patent Laying-Open No. 3-122097 discloses a method of preparing a GaAs crystal in a quartz ampoule wherein a carbon source is arranged internal to the ampoule and external to a crucible in fluid communication with a polycrystalline compound provided as a raw material to allow the GaAs crystal to be doped with carbon. "Fluid communication" means a free flow of vapor and heat between the inside and outside of the crucible which allows carbon to be transferred into the crucible and thus to a melt. In accordance with the method, a carbon disk is arranged on an opening of a cap. It discloses that the ingots of various doped levels can be provided by varying the amount of carbon arranged external to the opening and/or the crucible.

With this method, however, a large amount of carbon source is placed above the melt. Thus fine powder of carbon falls thereon and can thus vary the carbon concentration thereof. Particularly, the controllability can be poor at a slight carbon concentration corresponding to a level of $0.1 \times 10^{15}$ cm$^{-3}$ to $2 \times 10^{15}$ cm$^{-3}$.

Japanese Patent Laying-Open No. 64-79087 discloses a method of preparing a single crystal of GaAs doped with carbon to reduce dislocation, using a reactor or a boat for crystal growth at least partially formed of carbon. It discloses that when a graphite boat is used, a part of the carbon boat changes into a gas (CO or $CO_2$) due to oxygen derived from a small amount of $As_2O_3$, $Ga_2O$ or the like remaining in the quartz reactor and the gas is thus added to the single crystal of GaAs in synthesis reaction or in single-crystal growth.

In accordance with this method, however, it is difficult to control the carbon concentration in the crystal due to the difficulty of controlling the amount of $As_2O_3$, $Ga_2O$ or the like remaining in the quartz reactor. In particular, the controllability can be poor at a slight carbon concentration corresponding to a level of $0.1 \times 10^{15}$ cm$^{-3}$ to $2 \times 10^{15}$ cm$^{-3}$.

Japanese Patent Laying-Open No. 2-48496 discloses a method of preparing a Cr-doped, semi-insulating GaAs crystal wherein a quartz boat or a quartz crucible is used to grow the crystal under the existence of nitrogen oxide or carbon oxide. It discloses that when a GaAs crystal is grown under the existence of nitrogen oxide or carbon oxide, the oxide serves as an oxygen doping source to reduce the Si concentration of the grown crystal so that a semi-insulating crystal is reliably provided.

However, this method contemplates control of oxygen concentration and does not describe control of carbon concentration.

SUMMARY OF THE INVENTION

One object of the present invention is to provide a method of preparing a compound semiconductor crystal allowing the compound semiconductor crystal to be doped with carbon in high reproducibility, and a compound semiconductor crystal prepared thereby.

In one aspect of the present invention, a method of preparing a compound semiconductor crystal includes the steps of sealing carbon oxide gas of a predetermined partial pressure and a compound semiconductor provided as a raw material in a gas-impermeable airtight vessel, increasing the temperature of the airtight vessel to melt the compound semiconductor material sealed in the airtight vessel, and thereafter decreasing the temperature of the airtight vessel to solidify the melted compound semiconductor material to grow a compound semiconductor crystal containing a predetermined amount of carbon.

The carbon oxide gas includes at least one type of gas selected from the group consisting of CO gas and $CO_2$ gas.

In growing the crystal, preferably the melted compound semiconductor material is at least partially kept in contact with boron oxide ($B_2O_3$).

In growing the crystal, more preferably the melted compound semiconductor material has its upper surface entirely covered with boron oxide ($B_2O_3$).

Preferably, the boron oxide ($B_2O_3$) has a water content of no more than 300 ppm, more preferably no more than 100 ppm.

Preferably, variation of the water content of the boron oxide ($B_2O_3$) is controlled to fall within a range from +20% to −20%.

In accordance with the present invention, the carbon oxide gas sealed in the airtight vessel preferably has a partial pressure of 0.1 to 100 Torr at 25° C.

In accordance with the present invention, carbon oxide gas is preferably sealed in an airtight vessel according to an expression:

$$C_{CARBON} = a \times P^{0.5} \quad (1),$$

wherein $C_{CARBON\ (cm^{-3})}$ represents carbon concentration in a compound semiconductor crystal, P (Torr) represents partial pressure of the carbon oxide gas, and a represents any coefficient.

In expression (1) coefficient a preferably ranges from $0.25 \times 10^{15}$ to $4 \times 10^{15}$ cm$^{-3}$/Torr, more preferably $0.5 \times 10^{15}$ to $2 \times 10^{15}$ cm$^{-3}$/Torr.

In accordance with the present invention, preferably the step of subjecting the airtight vessel to a vacuum heat treatment is also provided before the step of sealing carbon oxide gas in the airtight vessel.

The vacuum heat treatment is preferably provided at a temperature of no more than 350° C.

In accordance with the present invention, at least the internal wall of the airtight vessel and at least the outer surface of the contents of the airtight vessel other than the compound semiconductor material and the boron oxide are preferably formed from a material which does not contain carbon.

The material which does not contain carbon includes at least one material selected from the group consisting, e.g., of quartz, silicon nitride, boron nitride, pyrolytic boron nitride and alumina.

In accordance with the present invention, the gas-impermeable airtight vessel can at least partially be formed from quartz.

Preferably, the portion formed from quartz has a thickness of no less than 1.5 mm.

In growing the crystal, preferably the portion formed from quartz is controlled to have a temperature of at most 1270° C.

In accordance with the present invention, in growing the crystal a space behind a raw-material melt of melted compound preferably has its most heated portion and its least heated portion with a temperature difference of no more than 300° C. therebetween.

In accordance with the present invention, the space behind the raw-material melt is preferably larger, more preferably no less than twice larger in volume than the space on the side of the raw-material melt.

A method of preparing a compound semiconductor crystal in accordance with the present invention is applicable to preparing a compound semiconductor crystal of GaAs.

In another aspect, the present invention provides a compound semiconductor crystal prepared in accordance with the above-described method of preparing a compound semiconductor crystal, having a carbon concentration of $0.1 \times 10^{15}$ cm$^{-3}$ to $20 \times 10^{15}$ cm$^{-3}$.

In accordance with the present invention, the compound semiconductor includes GaAs.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
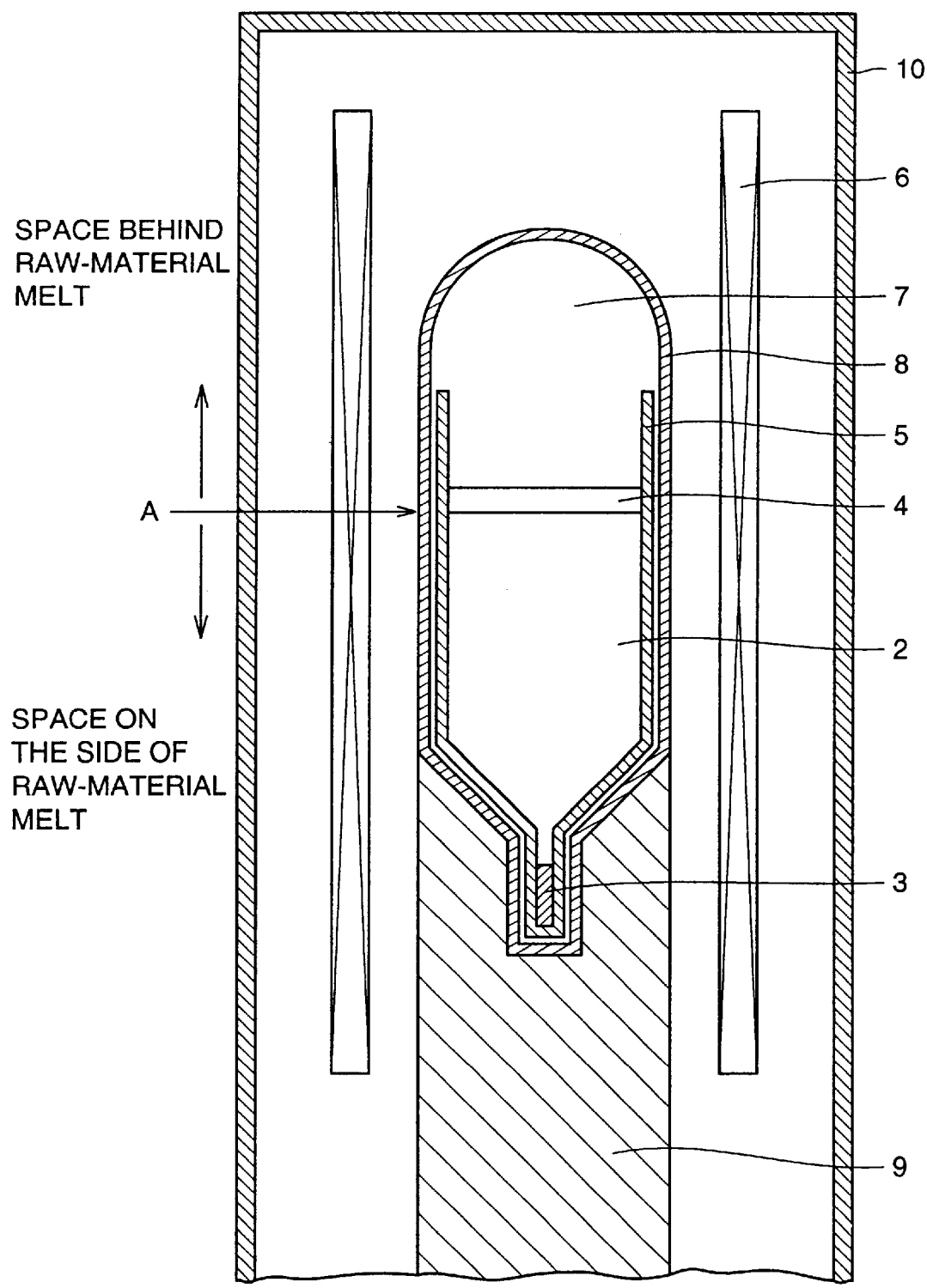
FIG. 1 shows preparation of a GaAs crystal as one example of a method of preparing a compound semiconductor crystal in accordance with the present invention.

The present invention is based on a method of preparing a compound semiconductor crystal in a sealed system (a system incapable of supplying a gas from outside an airtight vessel) using a gas-impermeable airtight vessel.

In accordance with the present invention, carbon oxide gas of a predetermined partial pressure as well as a compound semiconductor provided as a raw material are sealed in a gas-impermeable airtight vessel, the temperature of the airtight vessel is increased to melt the compound semiconductor material and the temperature of the airtight vessel is then decreased to solidify the melted compound semiconductor material to grow a compound semiconductor crystal to thereby allow the compound semiconductor crystal to be doped with carbon with high reproducibility.

As the carbon oxide gas, a stable CO or $CO_2$ gas can be used to allow the crystal to be doped with carbon in particularly high reproducibility.

In growing the crystal, preferably at least a portion of the melt of the compound semiconductor material can be kept in contact with boron oxide ($B_2O_3$) and more preferably the upper surface of the melt can be entirely covered with boron oxide ($B_2O_3$) to prevent other elements of impurities from being introduced into the melt so as to further enhance the reproducibility of the carbon concentration of the crystal.

To reduce an influence of the water contained in $B_2O_3$ to control the carbon concentration of the crystal in high reproducibility, $B_2O_3$ preferably has a water content of no more than 300 ppm, more preferably no more than 100 ppm. To reduce an influence of variation of the water content of $B_2O_3$ to control the carbon concentration of the crystal in high reproducibility, the variation of the water content of $B_2O_3$ is preferably controlled to fall within a range from +20% to −20%.

To obtain a practical carbon concentration for a compound semiconductor crystal, i.e., $0.1 \times 10^{15}$ cm$^{-3}$ to $20 \times 10^{15}$ cm$^{-3}$, carbon oxide gas requires a partial pressure of 0.1 to 100 Torr at 25° C., substantially establishing the relation: (carbon concentration in a compound semiconductor crystal)=a×(partial pressure of carbon oxide gas)$^{0.5}$, wherein a represents any coefficient and is preferably $0.25 \times 10^{15}$ to $4 \times 10^{15}$ cm$^{-3}$/Torr, more preferably $0.5 \times 10^{15}$ to $2 \times 10^{15}$ cm$^{-3}$/Torr.

Conventionally in the prior art, the ambient gas has been represented or quantified by its concentration. For example, an ambient gas for GaAs crystal growth typically has a pressure of 1 to 30 atm. When an ambient gas of 1 atm and an ambient gas of 30 atm which have the same gas concentration are converted into terms of partial pressure, the partial pressure of the latter is 30 times larger than that of the former.

The inventors of the present invention have found that in a method of preparing a compound semiconductor crystal in a sealed system (a system incapable of supplying a gas from outside an airtight vessel) using a gas-impermeable airtight vessel, the carbon concentration in the crystal is correlated to the partial pressure of the carbon oxide gas sealed in the airtight vessel rather than the concentration of the carbon oxide gas sealed in the airtight vessel.

Herein the carbon oxide gas sealed in the airtight vessel is represented in the partial pressure at 25° C., since the partial pressure of the carbon oxide gas increases as the temperature of the airtight vessel is increased in growing a crystal. Since a GaAs crystal has a melting point of approximately 1238° C., the partial pressure of the carbon oxide gas sealed at a room temperature (of 25° C.) is considered to be increased by approximately five times during the crystal growth.

While in accordance with the present invention, carbon oxide gas having a predetermined partial pressure is sealed in an airtight vessel, carbon oxide gas may be sealed together with another gas, which can include inert gases, such as helium, neon, argon, krypton, xenon, and nitrogen gas. When only carbon oxide gas is sealed in the vessel, it has a concentration of 100%. When carbon oxide gas is sealed, e.g., together with any of the above gases of 50%, the carbon oxide gas has a concentration of 50%. It should be noted, however, that if carbon oxide gas is thus sealed together with any of the above gases, the expression: (carbon concentration in a compound semiconductor crystal)=a× (partial pressure of carbon oxide gas)$^{0.5}$ is sufficiently satisfied by the coefficient a preferably having the value of $0.25 \times 10^{15}$ to $4 \times 10^{15}$ cm$^{-3}$/Torr, more preferably $0.5 \times 10^{15}$ to $2 \times 10^{15}$ cm$^{-3}$/Torr.

Removal of water absorbed in the airtight vessel further enhances the reproducibility of the carbon concentration in the crystal. Accordingly it is preferable to apply a vacuum heat treatment to the airtight vessel before it is sealed. The vacuum heat treatment applied immediately before the vessel is sealed is applied preferably at no more than 350° C., at which temperature $B_2O_3$ does not soften or deform.

To control the carbon concentration of the crystal in high reproducibility, at least the internal wall of the airtight vessel and at least the outer surface of the contents of the vessel other than the compound semiconductor as a raw material and boron oxide are preferably formed from a material which does not contain carbon, so that further generation of carbon oxide gas can be prevented in the vessel. More specifically, the airtight vessel is preferably formed from a material which does not contain carbon, or the vessel preferably has its internal wall coated with a material which does not contain carbon. It is also preferable that the contents of the airtight vessel other than the compound semiconductor material and boron oxide be formed from a material which does not contain carbon or that the contents have the outer surface coated with a material which does not contain carbon. The material which does not contain carbon is preferably quartz, silicon nitride, boron nitride, pyrolytic boron nitride or alumina.

Furthermore, the gas-impermeable airtight vessel of the present invention can at least partially be formed from quartz, since quartz has superior airtightness and hardly reacts with elements forming the compound semiconductor or carbon oxide gas.

In accordance with the present invention, carbon oxide gas having a predetermined partial pressure is sealed in a gas-impermeable airtight vessel. However, when the airtight vessel is deformed and its internal volume is changed, the partial pressure of the sealed carbon oxide gas is changed and the carbon concentration of the resulting compound semiconductor crystal will deviate from a targeted carbon concentration.

The strength of quartz is reduced at high temperature and is significantly reduced at a temperature at which a GaAs crystal is grown, i.e., 1238° C. If a gas-impermeable airtight vessel is at least partially formed from quartz, the difference between the pressure internal to the vessel and that external to the vessel deforms the quartz portion of the vessel and thus changes the internal volume of the vessel. The inventors of the present invention have found that as the vessel's quartz portion is increased in thickness, deformation of the quartz portion is reduced at high temperatures and variation in the vessel's internal volume is thus reduced. The inventors have also found that the quartz portion of the vessel preferably has a thickness of no less than 1.5 mm, more preferably no less than 2.0 mm, still more preferably no less than 2.5 mm.

The inventors have also found that as temperature is decreased, deformation of quartz is reduced and variation in the vessel's internal volume is reduced. The inventors have also found that the quartz portion of the vessel preferably has a temperature of at most 1270° C., more preferably at most 1260° C., further still more preferably at most 1250° C.

In accordance with the present invention, carbon oxide gas of a predetermined partial pressure is sealed in a gas-impermeable airtight vessel. When the temperature of the airtight vessel varies, however, the partial pressure of the sealed carbon oxide gas changes and the carbon concentration of the resulting compound semiconductor crystal thus deviates from a targeted carbon concentration.

In particular, the hollow gas-filled space on the side of the raw-material melt, more specifically, the space between the crucible 5 and the ampoule 8 located below the interface (labeled A in FIG. 1) of raw-material melt 2 and boron oxide 4, i.e., the space on the side of the seed crystal has its temperature reduced as crystal growth proceeds. When this hollow space on the side of the raw-material melt is large in volume, the average temperature and hence partial pressure of the carbon oxide gas in the airtight vessel are reduced significantly.

In contrast, the temperature of the hollow gas-filled space behind the raw-material melt, i.e., the hollow gas-filled space within the ampoule 8 located above interface A can be controlled regardless of crystal growth. Thus, controlling the temperature of this space behind the raw-material melt, can prevent reduction of the average temperature of the carbon oxide gas in the airtight vessel and reduce reduction of the partial pressure of the carbon oxide gas in the vessel. Reducing the temperature difference between the most and least heated portions of the space behind the raw-material melt can reduce reduction of the partial pressure of the carbon oxide gas in the vessel. The temperature difference between the most and the least heated portions of the space behind the melt is preferably no more than 300° C., more preferably no more than 200° C., still more preferably no more than 100° C.

When the hollow gas-filled space behind the raw-material melt is larger in volume than the hollow gas-filled space on the side of the raw-material melt, this can further reduce the reduction of the partial pressure of the carbon oxide gas in the vessel that is caused when the average temperature of the gas in the vessel is reduced. The space behind the raw-material melt is preferably no less than twice, more preferably no less than three times, still more preferably no less than four times larger in volume than that on the side of the raw-material melt.

Furthermore, the method of the present invention is particularly applicable to preparation of GaAs crystal.

Hereinafter, an example of actual preparation of a GaAs crystal in accordance with the present invention will now be described in detail.

FIG. 1 shows an exemplary method of preparing a compound semiconductor crystal in accordance with the present invention, using a gas-impermeable airtight vessel formed from quartz (referred to as a "quartz ampoule" hereinafter) to prepare a GaAs crystal.

Referring to FIG. 1, a GaAs seed crystal 3 of orientation <100>, 5 kg of GaAs 2 as a raw material, and 50 g of boron oxide 4 (referred to as "$B_2O_3$" hereinafter) with a water content of 70 ppm were initially placed in a crucible 5 formed from pyrolytic boron nitride (referred to as "pBN" hereinafter) and having an inner diameter of 80 mm and also having a cylindrical portion of approximately 30 cm in length, and crucible 5 was housed in a quartz ampoule 8 of 2.5 mm thickness. The space behind the raw-material melt placed in quartz ampoule 8, i.e., that located above the interface denoted by arrow A in FIG. 1 was adapted to be four times larger in volume than the space on the side of the raw-material melt, i.e., that located below interface A.

Quartz ampoule 8 was vacuumed to $1 \times 10^{-6}$ Torr and also heated to 300° C. to remove water adsorbed on the internal wall of ampoule 8 and the raw material. Then, $CO_2$ gas 7 of 3 Torr was introduced and sealed in ampoule 8. Ampoule 8 was mounted on a support 9 and thus set internal to a vertical heater 6 provided in a chamber 10, and the temperature of heater 6 was increased to melt GaAs material 2 and an upper portion of seed crystal 3.

Then the temperature profile of the heater was adjusted to decrease the temperature from the side of the seed crystal 3 and the entirety of raw-material melt 2 was thus solidified to grow a crystal. In the crystal growth, the highest temperature of ampoule 8 was also controlled not to exceed 1250°. Furthermore, the temperature of an upper portion of ampoule 8 was controlled so that the space located behind the raw-material melt, i.e., that located above interface A shown in FIG. 1 had its most heated portion and its least heated portion with a temperature difference of no more than 100° C. therebetween.

The temperature was reduced to a room temperature and quartz ampoule 8 was then cut and opened to separate a GaAs crystal from crucible 5.

Figure 2:
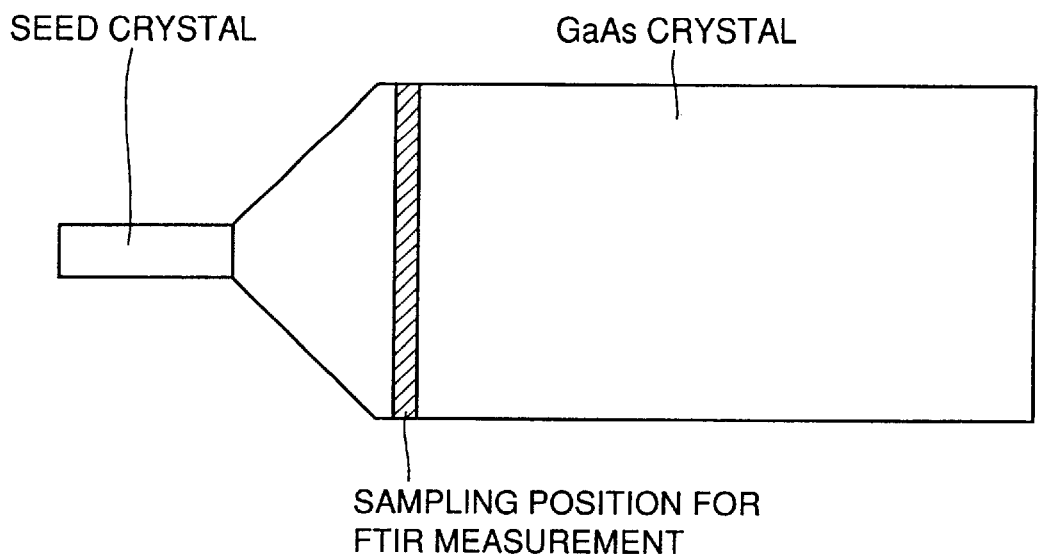
FIG. 2 shows a position of a sample for FTIR measurement in a crystal.
Figure 3:
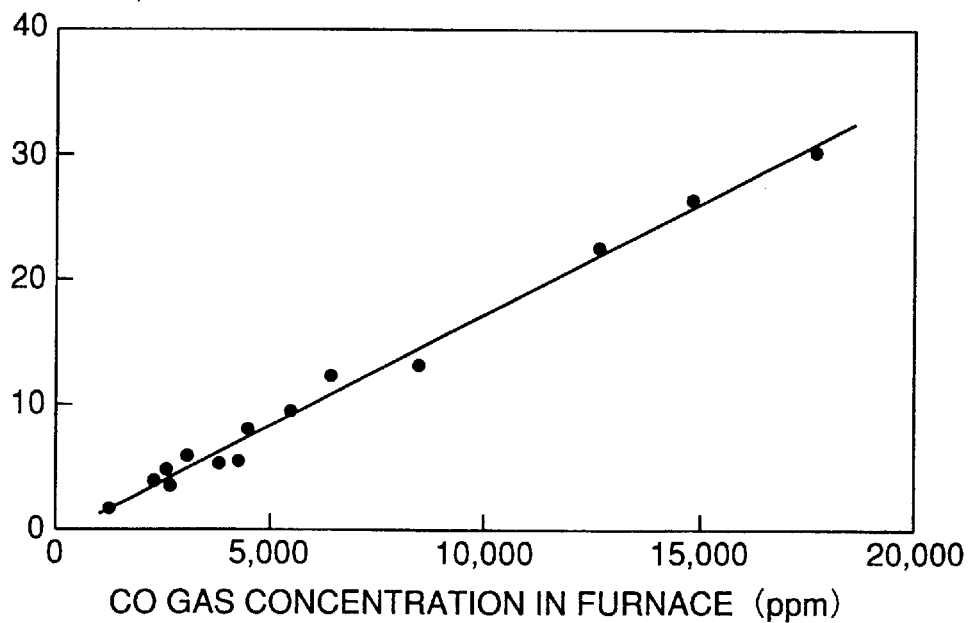
FIG. 3 is a graph of carbon concentration in a GaAs crystal versus CO gas concentration in a conventional LEC furnace.
Figure 4:
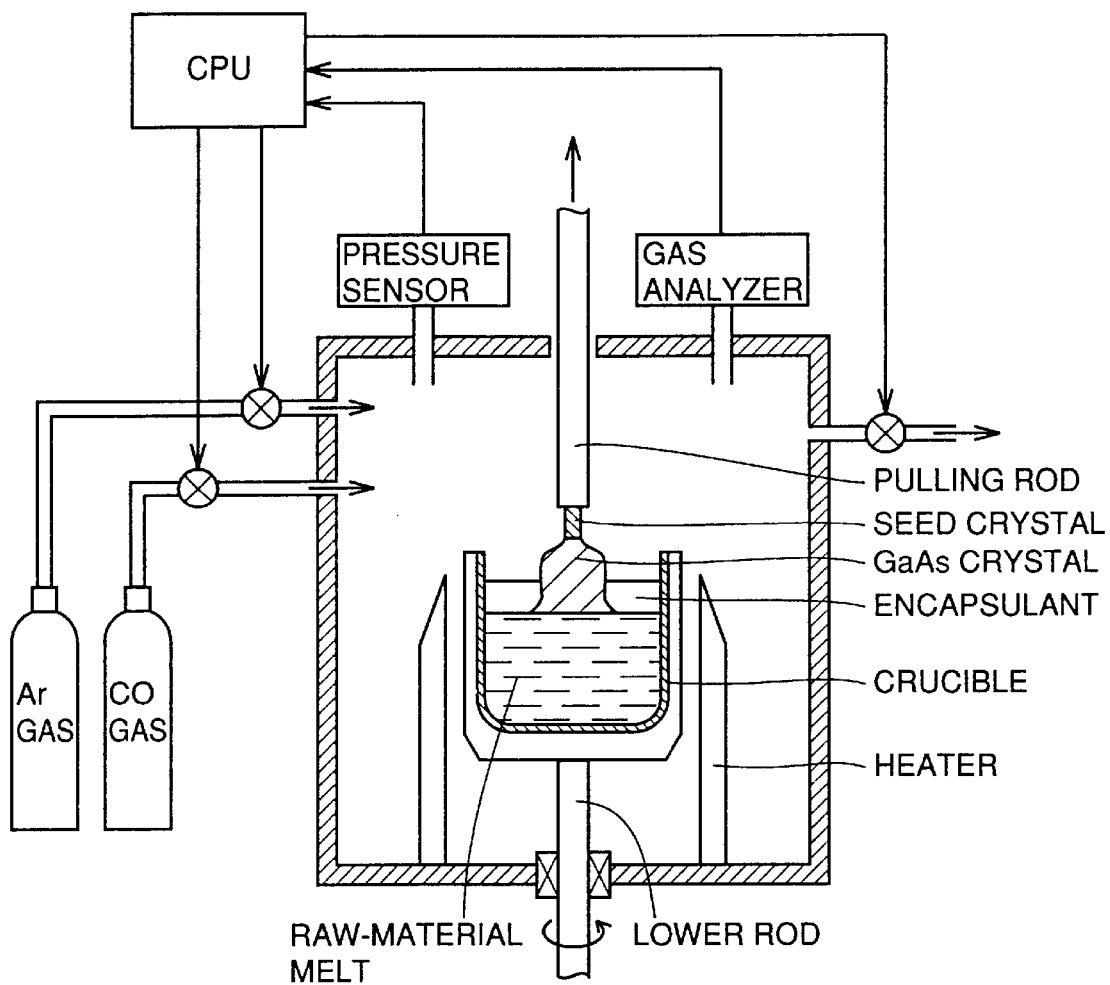
FIG. 4 shows one example of conventional GaAs crystal growth equipment for the LEC method.

The resulting GaAs crystal had a diameter of 80 mm, and the portion having the diameter of 80 mm was approximately 18 cm long. A sample of 5 mm thick for measurement of carbon concentration was cut out at the position of a shoulder of the crystal (fraction solidified: g of 0.1). FIG. 2 shows the position of the shoulder of the crystal from which the sample was cut out. Fourier Transform Infrared Spectroscopy (FTIR) was used to measure the concentration of the carbon substituted at an arsenic site (referred to as "$C_{As}$" hereinafter). The measured $C_{As}$ concentration was $2.1 \times 10^{15}$ cm$^{-3}$.

The $C_{As}$ concentration in the crystal grown under a different partial pressure of sealed $CO_2$ was similarly measured. The measured results are provided in Table 1.

TABLE 1

Partial pressure of sealed $CO_2$ gas and $C_{As}$ concentration in GaAs crystal

| Partial pressure of sealed $CO_2$ gas (Torr) | $C_{As}$ concentration in GaAs crystal (cm$^{-3}$) |
|---|---|
| 0.5 | $0.8 \times 10^{15}$ |
| 3.0 (embodiment) | $2.1 \times 10^{15}$ |
| 4.5 | $2.7 \times 10^{15}$ |
| 6.0 | $3.1 \times 10^{15}$ |
| 10.0 | $4.0 \times 10^{15}$ |
| 30.0 | $6.5 \times 10^{15}$ |
| 60.0 | $10.0 \times 10^{15}$ |
| 100.0 | $13.2 \times 10^{15}$ |

It has been found from the results presented in Table 1 that the relation: (carbon concentration in a compound semiconductor crystal)=a×(partial pressure of carbon oxide gas)$^{0.5}$ can be substantially established, wherein a≈$1.25 \times 10^{15}$ cm$^{-3}$/Torr under the conditions of the first embodiment.

As a result of experimentally growing a crystal under various conditions, it has been revealed that to obtain a value of a practical carbon concentration in a compound semiconductor crystal, i.e., $0.1 \times 10^{15}$ to $20 \times 10^{15}$ cm$^{-3}$, a preferable partial pressure of carbon oxide gas is 0.1 to 100 Torr at 25° C., substantially establishing the relation: (carbon concentration in a compound semiconductor crystal)=a×(partial pressure of carbon oxide gas)$^{0.5}$ and that coefficient a preferably ranges from $0.25 \times 10^{15}$ to $4 \times 10^{15}$ cm$^{-3}$/Torr, more preferably $0.5 \times 10^{15}$ to $2 \times 10^{15}$ cm$^{-3}$/Torr, since the coefficient can vary with the conditions of the experiment carried out.

It has also been found as a result of an experiment using $B_2O_3$ with its water content varied from 30 to 1000 ppm that the carbon concentration in the crystal can be controlled in higher reproducibility when the water content of $B_2O_3$ is lower and has less variation. Satisfactory reproducibility of the carbon concentration in crystal is achieved when the water content of $B_2O_3$ is no more than 300 ppm, particularly no more than 100 ppm and the variation of the water content of $B_2O_3$ is controlled to fall within a range from +20% to −20%. With $CO_2$ gas replaced by CO gas, a similar result has also been obtained in a similar manner.

Thus, the present invention can provide a method of preparing a compound semiconductor crystal in a sealed system (a system incapable of supplying a gas from outside an airtight vessel) using a gas-impermeable airtight vessel to allow the compound semiconductor crystal to be doped with carbon in high reproducibility.

Furthermore, carbon oxide gas of a predetermined partial pressure sealed in the gas-impermeable airtight vessel together with compound semiconductor provided as a raw material allows a compound semiconductor crystal with a desired carbon concentration and hence with a desired electrical characteristic to be prepared in high reproducibility, since the electrical characteristic of the compound semiconductor crystal depends on the carbon concentration of the crystal.

Thus the present invention can provide satisfactory crystal yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of preparing a compound semiconductor crystal having a dopant carbon content, said method comprising the following steps:

a) selecting a partial pressure of a carbon oxide gas dependent on said dopant carbon content in said compound semiconductor crystal;

b) sealing said carbon oxide gas having said partial pressure, and a semiconductor raw material, in a gas-impermeable airtight vessel;

c) after said step b), increasing a temperature of said airtight vessel to melt said semiconductor raw material in said airtight vessel and thereby form a melted material from said semiconductor raw material, wherein said melted material occupies a melt volume that is bounded along one plane by a melt interface of said melted material in said airtight vessel, said melt volume is located on a first side of said plane extending along said melt interface in said airtight vessel, said carbon oxide gas occupies a first gas-filled volume within said airtight vessel on said first side of said plane and a second gas-filled volume within said airtight vessel on a second side of said plane opposite said first side, and said second gas-filled volume is larger than said first gas-filled volume; and d) after said step c), decreasing said temperature of said airtight vessel to solidify said melted material and thereby grow said compound semiconductor crystal to have said dopant carbon content dependent on said partial pressure of said carbon oxide gas.

2. The method according to claim 1, wherein said second gas-filled volume is at least twice as large as said first gas-filled volume.

3. The method according to claim 1, wherein said second gas-filled volume is at least three times as large as said first gas-filled volume.

4. The method according to claim 1, wherein said second gas-filled volume is at least four times as large as said first gas-filled volume.

5. The method according to claim 1, wherein said step b) further comprises placing said semiconductor raw material in a crucible and sealing said crucible in said airtight vessel, wherein said first gas-filled volume is bounded between an outer wall surface of said crucible and an inner wall surface of said airtight vessel on said first side of said plane, and wherein said second gas-filled volume is defined by a remaining hollow gas-filled space within said airtight vessel on said second side of said plane.

6. The method according to claim 1, wherein said first gas-filled volume and said second gas-filled volume together make up a total hollow volume existing within said airtight vessel and being available for receiving said carbon oxide gas therein.

7. The method according to claim 1, wherein said carbon oxide gas includes at least one of CO gas and $CO_2$ gas.

8. The method according to claim 1, wherein said steps a) and b) are carried out so that said partial pressure of said carbon oxide gas is in a range from 0.1 to 100 Torr at 25° C.

9. The method according to claim 1, further comprising a step of subjecting said airtight vessel to a vacuum heat treatment before said step of sealing said carbon oxide gas in said airtight vessel.

10. The method according to claim 1, wherein said steps are carried out so that said dopant carbon content of said compound semiconductor crystal is in a range from $0.1 \times 10^{15}$ $cm^{-3}$ to $20 \times 10^{15}$ $cm^{-3}$.

11. The method according to claim 1, wherein said step b) further comprises sealing a boron oxide based substance together with said carbon oxide gas and said semiconductor raw material in said airtight vessel, and said step c) further comprises melting said boron oxide based substance to form a melted boron oxide layer along at least a portion of said melt interface of said melted material.

12. The method according to claim 11, further comprising selecting said boron oxide based substance to comprise boron oxide and not more than 300 ppm of water.

13. The method according to claim 1, further comprising, during said step d), controlling said temperature so that a hottest portion of said second gas-filled volume and a coolest portion of said second gas-filled volume have a temperature difference of no more than 300° C. therebetween.

14. The method according to claim 13, wherein said temperature difference is no more than 100° C.

15. The method according to claim 1, further comprising a preliminary step of providing said semiconductor raw material so that said compound semiconductor crystal contains GaAs.

16. The method according to claim 15, wherein said steps are carried out so that said dopant carbon content of said compound semiconductor crystal is in a range from $0.1 \times 10^{15}$ $cm^{-3}$ to $20 \times 10^{15}$ $cm^{-3}$.

17. The method according to claim 1, wherein said dopant carbon content in said compound semiconductor crystal corresponds to a resultant dopant carbon content.

18. The method according to claim 17, wherein said step a) comprises selecting said partial pressure according to a formula: $C_{CARBON} = a \times P^{0.5}$, wherein $C_{CARBON}$ represents said dopant carbon content as carbon per $cm^3$ of said compound semiconductor crystal, P represents said partial pressure in Torr, and a represents a dependence coefficient.

19. The method according to claim 18, wherein said dependence coefficient a is in a range from $0.25 \times 10^{15}$ $cm^{-3}/Torr$ to $4 \times 10^{15}$ $cm^{-3}/Torr$.

20. The method according to claim 18, wherein said dependence coefficient a is in a range from $0.5 \times 10^{15}$ $cm^{-3}/Torr$ to $2 \times 10^{15}$ $cm^{-3}/Torr$.

* * * * *

UNITED STATES PATENT AND TRADEMARK OFFICE
CERTIFICATE OF CORRECTION

PATENT NO. : 6,273,947 B1
DATED : August 14, 2001
INVENTOR(S) : Kawase et al.

It is certified that error appears in the above-identified patent and that said Letters Patent is hereby corrected as shown below:

Column 3,
Line 1, after "$C_{CARBON}$", replace "$_{(cm}{}^{-3})$" by -- $(cm^{-3})$ --;

Column 4,
Line 41, after "to", replace "20x10" by -- $20x10^{15}$ --;

Column 10,
Line 38, after "claim", replace "17" by -- 1 --.

Signed and Sealed this

Sixteenth Day of April, 2002

Attest:

JAMES E. ROGAN
*Attesting Officer*   *Director of the United States Patent and Trademark Office*

UNITED STATES PATENT AND TRADEMARK OFFICE
CERTIFICATE OF CORRECTION

PATENT NO. : 6,273,947 B1
DATED : August 14, 2001
INVENTOR(S) : Kawase et al.

It is certified that error appears in the above-identified patent and that said Letters Patent is hereby corrected as shown below:

Column 3,
Lines 7 and 8, replace "$cm^{-3}/Torr$" by -- $cm^{-3}/Torr^{0.5}$ --.

Column 4,
Lines 48 and 49, replace "$cm^{-3}/Torr$" by -- $cm^{-3}/Torr^{0.5}$ --.

Column 5,
Lines 22 and 23, replace "$cm^{-3}/Torr$" by -- $cm^{-3}/Torr^{0.5}$ --.

Column 8,
Line 15, replace "Torr" by -- $Torr^{0.5}$ --;
Lines 23 and 24, replace "$cm^{-3}/Torr$" by -- $cm^{-3}/Torr^{0.5}$ --.

Column 10,
Line 46, replace "$cm^{-3}/Torr$" (both occurrences) by -- $cm^{-3}/Torr^{0.5}$ --;
Line 49, replace "Torr" (1st occurrence) by -- $Torr^{0.5}$ --; replace "$cm^{-3}/Torr$" by -- $cm^{-3}/Torr^{0.5}$ --.

Signed and Sealed this

Third Day of June, 2003

JAMES E. ROGAN
*Director of the United States Patent and Trademark Office*